(12) United States Patent
Shah et al.

(10) Patent No.: US 7,612,585 B2
(45) Date of Patent: Nov. 3, 2009

(54) PULL-UP CIRCUIT FOR AN INPUT BUFFER

(75) Inventors: Pulkit Shah, Bangalore (IN); Prasad Kotra, Ejipura (IN)

(73) Assignee: Cypress Semiconductor Corporation, San Jose, CA (US)

( * ) Notice: Subject to any disclaimer, the term of this patent is extended or adjusted under 35 U.S.C. 154(b) by 15 days.

(21) Appl. No.: 11/654,445

(22) Filed: Jan. 17, 2007

(65) Prior Publication Data

US 2007/0164804 A1  Jul. 19, 2007

Related U.S. Application Data

(60) Provisional application No. 60/781,918, filed on Mar. 13, 2006.

(30) Foreign Application Priority Data

Jan. 17, 2006  (IN)  ............................. 73/CHE/2006

(51) Int. Cl.
*H03K 19/094* (2006.01)
(52) U.S. Cl. ............................... 326/87; 326/9; 326/33; 327/313
(58) Field of Classification Search .................. 326/30, 326/82, 85, 87, 91, 56, 80, 9, 14, 27, 31, 326/33, 34, 83, 86, 81; 327/318, 313
See application file for complete search history.

(56) References Cited

U.S. PATENT DOCUMENTS

| | | | | | |
|---|---|---|---|---|---|
| 5,966,026 | A | * | 10/1999 | Partovi et al. ................... | 326/27 |
| 6,005,413 | A | * | 12/1999 | Schmitt ........................ | 326/80 |
| 6,081,132 | A | * | 6/2000 | Isbara ........................... | 326/81 |
| 6,313,661 | B1 | * | 11/2001 | Hsu .............................. | 326/81 |
| 6,366,122 | B1 | * | 4/2002 | Krishnamurthy et al. ...... | 326/56 |
| 6,525,559 | B1 | * | 2/2003 | Wu et al. ....................... | 326/30 |
| 6,674,304 | B1 | * | 1/2004 | Matthews ...................... | 326/80 |
| 6,788,107 | B2 | * | 9/2004 | Wang ........................... | 326/81 |
| 7,521,966 | B2 | * | 4/2009 | Chong et al. ................... | 326/83 |
| 2005/0200381 | A1 | * | 9/2005 | Arai ............................. | 326/31 |

* cited by examiner

*Primary Examiner*—Vibol Tan
*Assistant Examiner*—Crystal L Hammond

(57) ABSTRACT

An input buffer has a high voltage leg in parallel with a low voltage leg. The low voltage leg pulls up the pad when the pad voltage is below the power supply voltage. The high voltage leg remains off when the pad voltage is below the power supply. The low voltage leg is turned off when the pad voltage is above the power supply voltage. The high voltage leg is on when the pad voltage is above power supply voltage. A low voltage bias circuit and a high voltage bias circuit protect the transistors in the low and voltage legs when the pad voltage is above the power supply voltage. As a result, the pull-up circuit is high voltage tolerant and does not sink the current from pad.

16 Claims, 5 Drawing Sheets

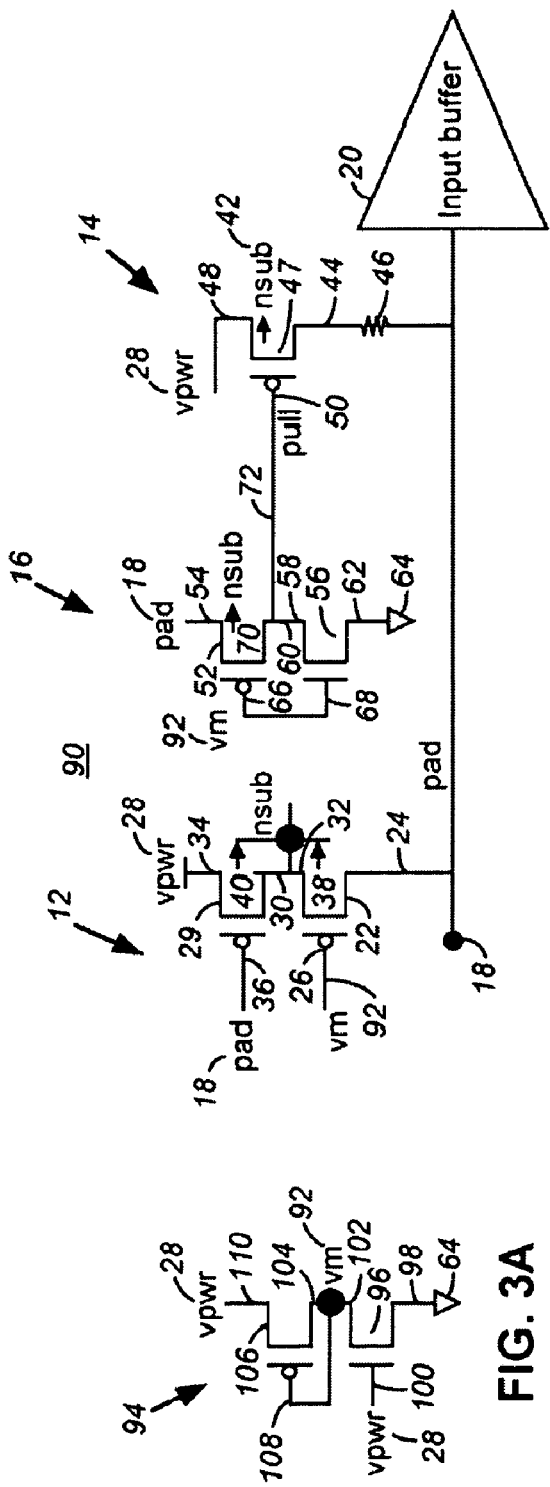

PULL-UP CIRCUIT FOR AN INPUT BUFFER

RELATED APPLICATIONS

The present application claims priority on India patent application No. 73/CHE/2006 filed on Jan. 17, 2006, entitled "High Voltage Tolerant Pull Up on Input Buffer".

The present invention claims priority on provisional patent application, Ser. No. 60/781,918, filed on Mar. 13, 2006, entitled "High Voltage Tolerant Pull Up on Input Buffer" and is hereby incorporated by reference.

FIELD OF THE INVENTION

The present invention relates generally to the field of electronic circuits and more particularly to an pull-up circuit for an input buffer.

BACKGROUND OF THE INVENTION

As integrated circuit (IC) process technology advances to higher densities, the feature size of a transistor is reduced, enabling low-voltage high speed operation and high density layout. Another result of the reduced feature size is to lower the transistor's gate oxide voltage tolerance. These transistors use lower supply voltages. For backward compatibility, a system can have different ICs having different supply. So one bus can be connected to different I/Os which are different supplies.

In many conventional input buffers, a weak pull up is used on input buffer to pull up the pad when it is not driven to avoid current flowing into the input buffer circuitry. In some conventional applications the pull up needs to be high voltage tolerant, without excess input high current (Iih). In addition, the weak pull up must be turned off when the pad voltage is higher than the power supply (vpwr), and the input pull up circuit should not take any current.

A conventional pull-up input buffer solution is shown in FIG. 1. The conventional solution comprises a pad coupled to a pull up resistor, the other end of which is coupled to the drain of a transistor. The source of the transistor is coupled to power (Vpwr), and the gate of the transistor is couple to an enable signal. The pad is also coupled to the input of an input buffer.

Disadvantages of the conventional solution include that when the pull up is enabled, if the pad voltage is higher than the power supply (vpwr) then the pull up circuit will sink the current from the pad. Current will flow from the pad to vpwr through the transistor and the parasitic diode of transistor, which is undesirable.

In the conventional solution when the pull up option is disabled (enable signal (en_n) is connected to (vpwr), if the pad is higher than vpwr plus one threshold voltage (vpwr+VT) then the pull up circuit will still sink the current from pad (VT is the threshold voltage of PMOS transistor). Current will also flow from the pad to vpwr through the transistor and the parasitic diode of the transistor.

It would be desirable to have a high voltage tolerant pull up option.

SUMMARY OF INVENTION

A pull-up circuit for an input buffer that overcomes these and other problems has a high voltage leg in parallel with a low voltage leg. The low voltage leg pulls up the pad when the pad voltage is below the power supply voltage. The high voltage leg remains off when the pad voltage is below the power supply. The low voltage leg is turned off when the pad voltage is above the power supply voltage. The high voltage leg is on when the pad voltage is above power supply voltage. A low voltage bias circuit and a high voltage bias circuit protect the transistors in the low and voltage legs when the pad voltage is above the power supply voltage. As a result, the pull-up circuit is high voltage tolerant and does not sink the current from pad.

BRIEF DESCRIPTION OF THE DRAWINGS

FIG. 3 is a circuit diagram of a pull-up circuit for an input buffer in accordance with one embodiment of the invention;

FIG. 3A is a circuit diagram of a high voltage leg bias circuit in accordance with one embodiment of the invention;

FIG. 3B is a graph of the voltage at the node nsub of the pull-up circuit of FIG. 3 versus the pad voltage in accordance with one embodiment of the invention;

FIG. 3C is a graph of the voltage at the node pull of the pull-up circuit of FIG. 3 versus the pad voltage in accordance with one embodiment of the invention.

DETAILED DESCRIPTION OF THE DRAWINGS

The present invention is directed to a pull-up circuit for an input buffer that has a high voltage leg in parallel with a low voltage leg. The low voltage leg pulls up the pad when the pad voltage is below the power supply voltage. The high voltage leg remains off when the pad voltage is below the power supply. The low voltage leg is turned off when the pad voltage is above the power supply voltage. The high voltage leg is on when the pad voltage is above power supply voltage. A low voltage bias circuit and a high voltage bias circuit protect the transistors in the low and voltage legs when the pad voltage is above the power supply voltage. As a result, the pull-up circuit is high voltage tolerant and does not sink the current from pad.

Figure 1:
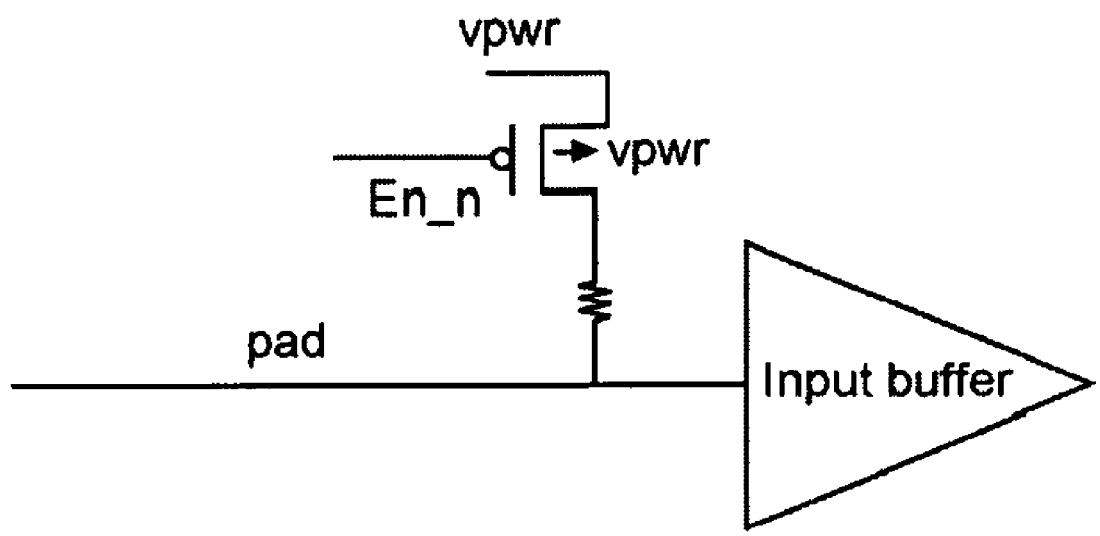
FIG. 1 is a circuit diagram of a prior art pull-up circuit for an input buffer.
Figure 2:
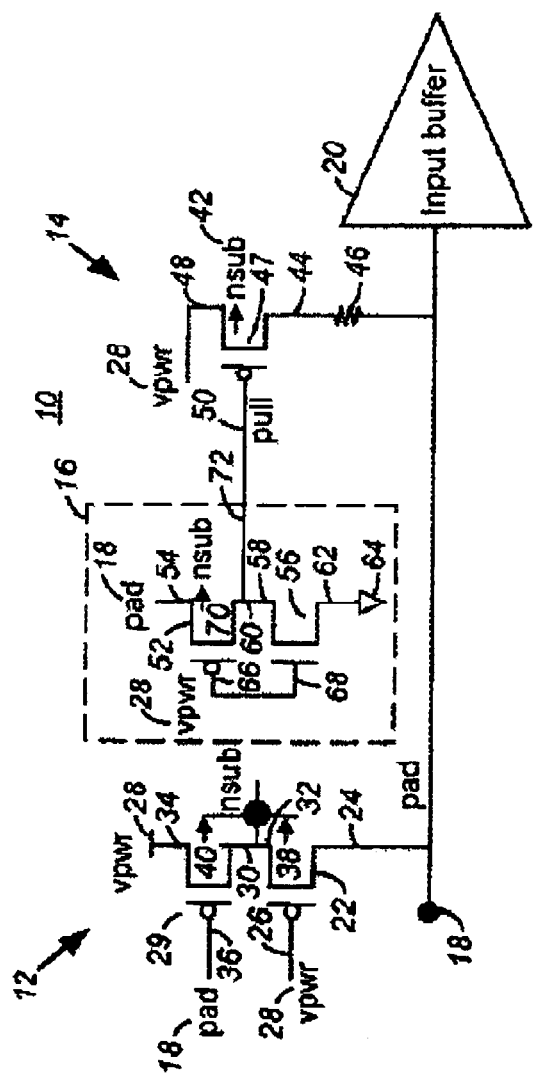
FIG. 2 is a circuit diagram of a pull-up circuit for an input buffer in accordance with one embodiment of the invention.

FIG. 2 is a circuit diagram of a pull-up circuit 10 for an input buffer in accordance with one embodiment of the invention. The pull-up circuit 10 has a high voltage leg 12 and a low voltage leg 14 in parallel. A low voltage bias circuit 16 is coupled to the low voltage leg 14. A pad 18 is coupled to the low voltage leg 14 and the high voltage leg 12 and to an input buffer 20. The high voltage leg 12 has a first PMOS FET (Field Effect Transistor) transistor 22 with a drain 24 coupled to the pad 18 and the gate 26 coupled to a power supply voltage (Vpwr) 28. A second PMOS transistor 29 has a drain 30 coupled to a source 32 of the first PMOS transistor 22. A source 34 of transistor 29 is coupled to vpwr 28 and a gate 36 is coupled to the pad 18. Note that the n-well 38 of transistor 22 is coupled to the n-well 40 of the transistor 29 to form node "nsub" which is coupled to the drain of transistor 29 and source of transistor 22.

The low voltage power leg 14 has a third PMOS transistor 42 having a drain 44 coupled to a resistor 46. Note that the n-well 47 of transistor 42 is coupled to the node "nsub". The other end of the resistor 46 is coupled to the pad 18. The transistor 42 has a source 48 coupled to vpwr 28. The gate 50 of transistor 42 forms the node "pull" and is coupled to the low voltage bias circuit 16. The low voltage bias circuit 16 has a PMOS transistor 52 with a source 54 coupled to the pad 18. A NMOS transistor 56 has a source 58 coupled a drain 60 of transistor 52 and a drain 62 coupled to ground 64. The gate 66 of transistor 52 is coupled to the gate 68 of transistor 56 and to the power supply voltage 28. The n-well 70 of transistor 52 is coupled to the node "nsub". The drain 60 of transistor 52 and the source 58 of transistor 56 forms the output 72 of the low voltage bias circuit 16.

Figure 2B:
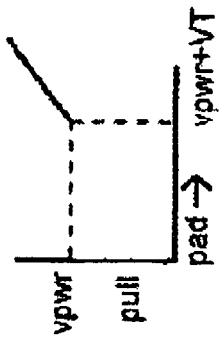
FIG. 2B is a graph of the voltage at the node pull of the pull-up circuit of FIG. 2 versus the pad voltage in accordance with one embodiment of the invention.
Figure 2A:
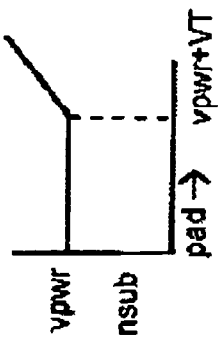
FIG. 2A is a graph of the voltage at the node nsub of the pull-up circuit of FIG. 2 versus the pad voltage in accordance with one embodiment of the invention.

FIG. 2A is a graph of the voltage at the node nsub of the pull-up circuit of FIG. 2 versus the pad voltage in accordance with one embodiment of the invention. As shown by the graph the voltage of the node "nsub" is "vpwr" until the pad voltage exceed "vpwr+Vt".

FIG. 2B is a graph of the voltage at the node pull of the pull-up circuit of FIG. 2 versus the pad voltage in accordance with one embodiment of the invention. As shown by the graph the voltage of the node "pull" is off until the pad voltage exceeds "vpwr+Vt" and then it tracks the pad voltage.

In operation, when the pad 18 voltage is lower than Vpwr 28 then transistor 42 will turn on and it will drive the pad voltage to the power supply voltage. The transistor 22 will be off and therefore the high voltage leg 12 will be off. When the pad 18 voltage is greater than power supply voltage plus one threshold voltage (vpwr+VT) then the output 72 of the low voltage bias circuit 16 will follow the pad voltage and it will turn off transistor 42. The transistor 22 will be on when pad 18 voltage is greater than power supply voltage plus one threshold voltage (vpwr+VT) and will essentially track the pad voltage. This way the weak pull up circuit 10 will not take any current when the pad voltage is at a high voltage level.

Figure 2C:
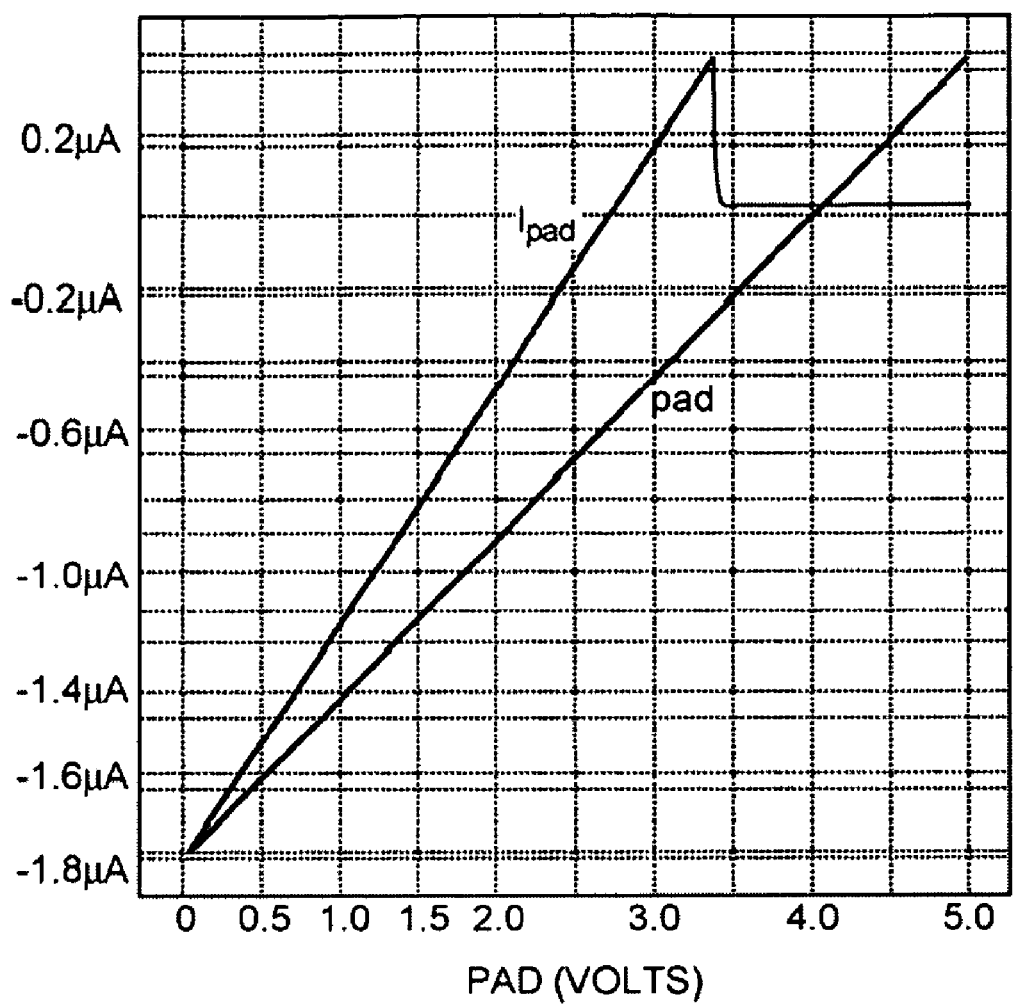
FIG. 2C is a graph of the pad current of the pull-up circuit of FIG. 2 versus the pad voltage in accordance with one embodiment of the invention.

FIG. 2C is a graph of the pad current of the pull-up circuit of FIG. 2 versus the pad voltage in accordance with one embodiment of the invention. FIG. 2C shows that the pad current becomes negligible when the pad is at vpwr plus one threshold voltage (vpwr+VT). With a 2.75V supply and when the pad is at 5V, the pad does not sink the current. This circuit is suitable also for the application where the difference is more than one threshold voltage (VT) between the high voltage and vpwr.

Note that an input buffer converts a high voltage input signal (pad) into a low voltage output. The power supply voltage 28 in the pull-up circuit is the high voltage power supply.

FIG. 3 is a circuit diagram of a pull-up circuit for an input buffer in accordance with one embodiment of the invention. Note that FIG. 3 is a similar circuit to that shown in FIG. 2 and therefore similar parts of the circuits will be given the same reference numerals. The pull-up circuit 90 has a high voltage leg 12 and a low voltage leg 14 in parallel. A low voltage bias circuit 16 is coupled to the low voltage leg 14. A pad 18 is coupled to the low voltage leg 14 and the high voltage leg 12 and to an input buffer 20. The high voltage leg 12 has a first PMOS FET (Field Effect Transistor) transistor 22 with a drain 24 coupled to the pad 18 and the gate 26 coupled to a node (Vm) 92. A second PMOS transistor 29 has a drain 30 coupled to a source 32 of the first PMOS transistor 22. A source 34 of transistor 28 is coupled to vpwr 28 and a gate 36 is coupled to the pad 18. Note that the n-well 38 of transistor 22 is coupled to the n-well 40 of the transistor 29 to form node "nsub" which is coupled to the drain of transistor 29 and source of transistor 22.

The low voltage power leg 14 has a third PMOS transistor 42 having a drain 44 coupled to a resistor 46. Note that the n-well 47 of transistor 42 is coupled to the node "nsub". The other end of the resistor 46 is coupled to the pad 18. The transistor 42 has a source 48 coupled to vpwr 28. The gate 50 of transistor 42 forms the node "pull" and is coupled to the low voltage bias circuit 16. The low voltage bias circuit 16 has a PMOS transistor 52 with a source 54 coupled to the pad 18. A nmos transistor 56 has a source 58 coupled a drain 60 of transistor 52 and a drain 62 coupled to ground 64. The gate 66 of transistor 52 is coupled to the gate 68 of transistor 56 and to the node "vm" 92. The n-well 70 of transistor 52 is coupled to the node "nsub". The drain 60 of transistor 52 and the source 58 of transistor 56 forms the output 72 of the low voltage bias circuit 16.

FIG. 3A is a circuit diagram of a high voltage leg bias circuit 94 in accordance with one embodiment of the invention. A high voltage bias circuit 94 controls the node voltage "vm" 92. The high voltage bias circuit 94 has a nmos transistor 96 with a drain 98 coupled to ground 64. A gate 100 of transistor 96 is coupled to the power supply voltage 28. The source 102 of transistor 96 is coupled to the drain 104 of PMOS transistor 106 and to the gate 108 of transistor 106. The source 110 of transistor 106 is coupled to the power supply voltage 28.

FIG. 3B is a graph of the voltage at the node nsub of the pull-up circuit of FIG. 2 versus the pad voltage in accordance with one embodiment of the invention. As shown by the graph the voltage of the node "nsub" is "vpwr" until the pad voltage exceed "vpwr+Vt".

FIG. 3C is a graph of the voltage at the node pull of the pull-up circuit of FIG. 2 versus the pad voltage in accordance with one embodiment of the invention. As shown by the graph the voltage of the node "pull" is off until the pad voltage exceeds "vpwr+Vt" and then it tracks the pad voltage In operation, the bias voltage "vm" 92 is generated which is vpwr 28 minus one threshold voltage (vpwr−VT). This bias voltage "vm" is passed to transistor 22 connected to pad 18 and transistor 52 used in the PMOS-nmos stack of the low voltage bias circuit 16. The voltage of the Nwells 38, 40 and 47 follow the pad voltage when the pad 18 is at or below the power supply voltage 28. The gate 50 of transistor 42 follows the pad voltage when the pad is at or above the power supply voltage (vpwr) 28. In this circuit 90 the current will not flow when the pad is at 3V and vpwr is at 2.75V in one embodiment.

Figure 3D:
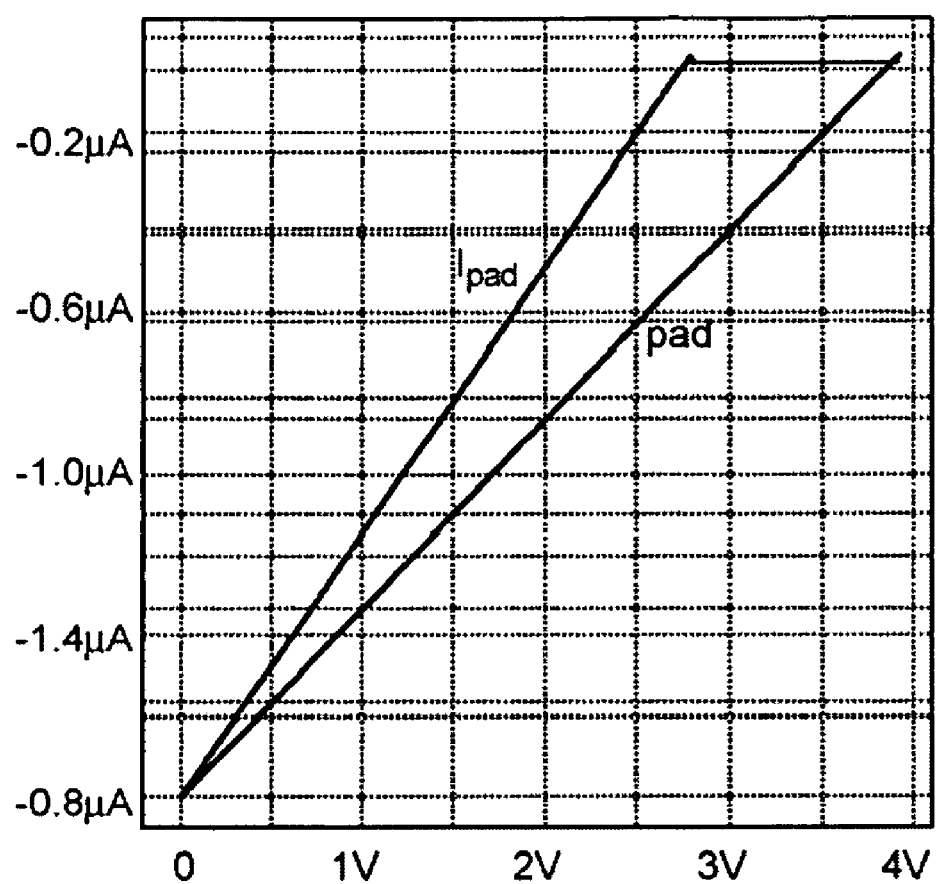
FIG. 3D is a graph of the pad current of the pull-up circuit of FIG. 3 versus the pad voltage in accordance with one embodiment of the invention.

FIG. 3D is a graph of the pad current of the pull-up circuit of FIG. 3 versus the pad voltage in accordance with one embodiment of the invention. FIG. 3D shows that the pad current becomes negligible when the pad voltage is at power supply voltage. With a 2.75V supply and when the pad is at 3V, the pad does not sink current in one embodiment.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A pull-up circuit for an input buffer, comprising:
a pad;
a first PMOS transistor having a gate is directly electrically coupled to the pad and a source and a drain;

a second PMOS transistor having a source and a drain, wherein the first and second PMO transistors are coupled in series, and the drain of the second PMOS transistor is coupled to the pad;

a first node coupled to substrates of the first PMOS transistor and the second PMOS transistor;

a power supply coupled to the source of the first PMOS transistor; and a resistor coupled to a drain of a third PMOS transistor and coupled to the pad, where a source of the third PMOS transistor is coupled to power and a gate of the third PMOS transistor is coupled to the output of a PMOS-NMOS stack.

2. The circuit of claim 1, further comprising where the gates of the PMOS-NMOS stack are coupled together, and a source of the PMOS in the PMOS-NMOS stack is coupled to the pad, and the drain of the NMOS in the PMOS-NMOS stack is coupled to ground.

3. The circuit of claim 1, wherein the first node is coupled to the drain of the first PMOS transistor.

4. The circuit of claim 1, wherein a gate of the second PMOS transistor is coupled to the power supply.

5. A pull-up circuit for an input buffer comprising:
a pad;
a high voltage pull-up leg having a node coupled to the pad;
a high voltage gate bias circuit including a PMOS-NMOS stack having an output node coupled to the high voltage pull-up leg; and
a low voltage pull-up leg electrically in parallel with the high voltage pull-up leg.

6. The circuit of claim 5, further including a low voltage gate bias circuit couple to the low voltage pull-up leg.

7. The circuit of claim 5, wherein:
the high voltage pull-up leg includes a first PMOS transistor having a drain coupled to the pad and a second PMOS transistor having a drain coupled to a source of the first PMOS transistor;
an n-well of the first PMOS transistor is electrically coupled to an n-well of the second PMOS transistor; and
wherein a gate of the second PMOS transistor is electrically coupled to the pad.

8. The circuit of claim 7, wherein the PMOS in the PMOS-NMOS stack includes a source coupled to a power supply and a drain coupled a source of the NMOS in the PMOS-NMOS stack, and wherein the output node is coupled between the source of the NMOS and the drain of the PMOS in the PMOS-NMOS stack.

9. The circuit of claim 8, wherein the PMOS in the PMOS-NMOS stack further includes a gate coupled to the output node, and wherein the NMOS further includes a gate coupled to the power supply.

10. The circuit of claim 8, wherein the NMOS in the PMOS-NMOS stack further includes a drain coupled to ground.

11. A pull-up circuit for an input Buffer, comprising:
a pad;
a low voltage pull-up leg including a PMOS transistor having a drain coupled to the pad through a resistor and a source coupled to a power supply; and
a low voltage gate bias circuit coupled to the low voltage pull-up leg, the low voltage gate bias circuit including a PMOS-NMOS stack an output of which is coupled to a gate of the PMOS transistor in the low voltage pull-up leg,
wherein gates of the NMOS and PMOS in the PMOS-NMOS stack are coupled together, and a source of the PMOS in the PMOS-NMOS stack is coupled to the pad, and the drain of the NMOS in the PMOS-NMOS stack is coupled to ground.

12. The circuit of claim 11, wherein the PMOS in the PMOS-NMOS stack includes a drain coupled a source of the NMOS, and wherein the output of the PMOS-NMOS stack is taken from a node between the source of the NMOS and the drain of the PMOS in the PMOS-NMOS stack.

13. The circuit of claim 11, wherein gates of the NMOS and PMOS in the PMOS-NMOS stack are coupled to the power supply.

14. The circuit of claim 11, further comprising a high voltage pull-up leg electricaly in parallel with the low voltage pull-up leg.

15. The circuit of claim 11, further comprising a high voltage gate bias circuit coupled to the high voltage pull-up leg.

16. The circuit of claim 15, wherein the high voltage gate bias circuit comprises a second PMOS-NMOS stack, and wherein gates of the NMOS and PMOS in the PMOS-NMOS stack of the low voltage gate bias circuit are coupled to an output node of the second PMOS-NMOS stack.

* * * * *